(12) United States Patent
Parks

(10) Patent No.: US 7,153,388 B2
(45) Date of Patent: Dec. 26, 2006

(54) CHAMBER FOR HIGH-PRESSURE WAFER PROCESSING AND METHOD FOR MAKING THE SAME

(75) Inventor: John Parks, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 208 days.

(21) Appl. No.: 10/404,502

(22) Filed: Mar. 31, 2003

(65) Prior Publication Data
US 2004/0187792 A1 Sep. 30, 2004

(51) Int. Cl.
C23F 1/00 (2006.01)
H01L 21/306 (2006.01)
B08B 3/00 (2006.01)
C23C 16/00 (2006.01)

(52) U.S. Cl. .............. 156/345.51; 156/345.23; 156/345.51; 156/345.54; 134/137; 134/140; 134/165; 134/902; 118/729; 118/733; 118/503

(58) Field of Classification Search ................ 134/137, 134/140, 165, 902
See application file for complete search history.

(56) References Cited

U.S. PATENT DOCUMENTS

| | | | | |
|---|---|---|---|---|
| 4,542,298 A | * | 9/1985 | Holden | 250/443.1 |
| 5,518,771 A | * | 5/1996 | Jeffryes et al. | 427/331 |
| 5,853,559 A | * | 12/1998 | Tamaki et al. | 205/157 |
| 5,972,163 A | * | 10/1999 | Haji | 156/345.54 |
| 6,024,631 A | | 2/2000 | Piper | |
| 6,032,997 A | | 3/2000 | Elliott et al. | |
| 6,279,917 B1 | * | 8/2001 | Jeffryes et al. | 277/650 |
| 6,279,976 B1 | | 8/2001 | Ball | |
| 6,454,864 B1 | * | 9/2002 | Wytman | 118/728 |
| 2002/0046707 A1 | * | 4/2002 | Biberger et al. | 118/733 |
| 2003/0037457 A1 | | 2/2003 | Bailey et al. | |
| 2003/0047551 A1 | | 3/2003 | Worm et al. | |
| 2003/0232512 A1 | * | 12/2003 | Dickinson et al. | 438/786 |

FOREIGN PATENT DOCUMENTS

| | | |
|---|---|---|
| EP | 0408350 A2 | 1/1991 |
| EP | 0463853 A1 | 1/1992 |
| EP | 0825279 A1 | 2/1998 |
| JP | 05144740 A * | 6/1993 |
| WO | WO-00/05750 | 2/2000 |
| WO | WO-02/059947 | 8/2002 |

* cited by examiner

*Primary Examiner*—Karla Moore
(74) *Attorney, Agent, or Firm*—Martine Penilla & Gencarella, LLP

(57) ABSTRACT

Broadly speaking, a wafer processing chamber for performing a high pressure wafer process is provided. More specifically, the wafer processing chamber incorporates a wafer processing volume and an outer chamber volume. The wafer processing volume is configured to contain a high pressure. The outer chamber volume is configured to serve as a buffer between the high pressure of the wafer processing volume and a lower pressure of an environment outside the wafer processing chamber. Thus, the outer chamber volume can control a pressure differential between the high pressure wafer processing volume and the lower pressure outside environment. In this manner, the wafer processing chamber, incorporating the high pressure wafer processing volume, can interface with a conventional wafer transfer module operating under either atmospheric or sub-atmospheric pressure conditions.

24 Claims, 5 Drawing Sheets

CHAMBER FOR HIGH-PRESSURE WAFER PROCESSING AND METHOD FOR MAKING THE SAME

BACKGROUND OF THE INVENTION

1. Field of the Invention

The present invention relates generally to semiconductor wafer processing. More specifically, the present invention relates to a chamber in which a high-pressure semiconductor wafer process can be performed.

2. Description of the Related Art

In the manufacture of semiconductor devices, a surface of a semiconductor wafer ("wafer" or "substrate") must be processed in a wafer processing operation. For example, in a wafer cleaning process, the surface of the wafer is processed to remove chemical and particulate contamination. If the contamination is not removed, semiconductor devices on the wafer may perform poorly or become defective. Often, the wafer processing operations need to be performed under high-pressure conditions. Continuing with the wafer cleaning process example, some wafer cleaning processes involve exposing the wafer surface to a supercritical fluid. In such processes, a high-pressure must be provided within a wafer processing volume to maintain the supercritical state of the supercritical fluid. Therefore, a wafer processing module (i.e., chamber) is required to maintain the high-pressure necessary for the wafer processing operation.

Typically, a number of different wafer processing operations are performed by a number of different wafer processing modules. In some instances the different wafer processing modules are attached to a common wafer transfer module that serves to transfer the wafer from one wafer processing module to another. FIG. 1 is an illustration showing a number of wafer processing modules 107A–107D attached to a wafer transfer module 101, in accordance with the prior art. The wafer transfer module 101 is generally isolated from a clean room 103 by a load/lock module 105. The wafer can be transferred from the clean room 103 through a slit valve 111F into the load/lock module 105. From the load/lock module 105, the wafer can be transferred through a slit valve 111E into the wafer transfer module 101. A robotic wafer handling device 109 can be provided to transfer the wafer to one of the number of wafer processing modules 107A–107D. Each of the number of wafer processing modules 107A–107D can be isolated from the wafer transfer module 101 by one of a number of slit valves 111A–111D, respectively. Each of the slit valves 111A–111D must be capable of withstanding a pressure differential that exists between each of the wafer processing modules 107A–107D and the wafer transfer module 101. The wafer transfer module 101 is typically maintained at atmospheric or sub-atmospheric pressure. Therefore, if either of the wafer processing modules 107A–107D operate at a higher pressure, the pressure differential between the wafer processing module 107A–107D and the wafer transfer module 101 can become significant.

In view of the foregoing, there is a need for a high-pressure wafer processing module that can safely interface with a lower pressure wafer transfer module through a conventional slit valve. The high-pressure wafer processing module should be able to accommodate a high-pressure wafer process such as supercritical fluid cleaning.

SUMMARY OF THE INVENTION

Broadly speaking, the present invention fills these needs by providing a wafer processing chamber for performing a high pressure wafer process. More specifically, the wafer processing chamber incorporates a wafer processing volume and an outer chamber volume. The wafer processing volume is configured to contain a high pressure. The outer chamber volume is configured to serve as a buffer between the high pressure of the wafer processing volume and a lower pressure of an environment outside the wafer processing chamber. Thus, the outer chamber volume can control a pressure differential between the high pressure wafer processing volume and the lower pressure outside environment. In this manner, the wafer processing chamber, incorporating the high pressure wafer processing volume, can interface with a conventional wafer transfer module operating under either atmospheric or sub-atmospheric pressure conditions. It should be appreciated that the present invention can be implemented in numerous ways, including as a process, an apparatus, a system, a device, or a method. Several embodiments of the present invention are described below.

In one embodiment, a wafer processing chamber is disclosed. The wafer processing chamber includes an upper section that is secured in an immobile state. The upper section includes both a pathway for receiving a wafer and a bottom opening. Also in the wafer processing chamber, a lower section is provided to be moved through the bottom opening of the upper section. Correspondingly, the lower section is connected to a movement mechanism. The wafer processing chamber further includes a first seal and a second seal. The first seal is disposed between the lower section and the upper section within the bottom opening of the upper section. The second seal is disposed on a top surface of the lower section. The second seal is configured to be enabled through contact with both the upper section and the lower section. The second seal encloses a periphery of a wafer processing volume when in contact with both the upper section and the lower section.

In another embodiment, another version of a wafer processing chamber is disclosed. The wafer processing chamber includes a lower section that is secured in an immobile state. The lower section includes both a pathway for receiving a wafer and a top opening. Also in the wafer processing chamber, an upper section is provided to be moved through the top opening of the lower section. Correspondingly, the upper section is connected to a movement mechanism. The wafer processing chamber further includes a first seal and a second seal. The first seal is disposed between the upper section and the lower section within the top opening of the lower section. The second seal is disposed on a top surface of the lower section and within the top opening of the lower section. The second seal is configured to be enabled through contact with both the lower section and the upper section. The second seal encloses a periphery of a wafer processing volume when in contact with both the lower section and the upper section.

In yet another embodiment, a method for making a wafer processing chamber is disclosed. The method includes providing both a chamber upper section and a chamber lower section. The chamber upper section and the chamber lower section are configured to be movable with respect to each other. The method further includes providing a first seal between the chamber upper section and the chamber lower section. The first seal serves to isolate a chamber outer volume from an outside environment. Additionally in the method, a second seal is provided between the chamber upper section and the chamber lower section. The second seal is configured to enclose a periphery of a wafer processing volume. Also, the second seal serves to isolate the wafer processing volume from the chamber outer volume. The second seal is enabled through contact with both the chamber upper section and the chamber lower section.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Broadly speaking, an invention is disclosed for a wafer processing chamber for performing a high-pressure wafer process. More specifically, the wafer processing chamber incorporates a wafer processing volume and an outer chamber volume. The wafer processing volume is configured to contain a high pressure. The outer chamber volume is configured to serve as a buffer between the high pressure of the wafer processing volume and a lower pressure of an environment outside the wafer processing chamber. Thus, the outer chamber volume can control a pressure differential between the higher pressure wafer processing volume and the lower pressure outside environment. In this manner, the wafer processing chamber, incorporating the high-pressure wafer processing volume, can interface with a conventional wafer transfer module operating under either atmospheric or sub-atmospheric pressure conditions.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
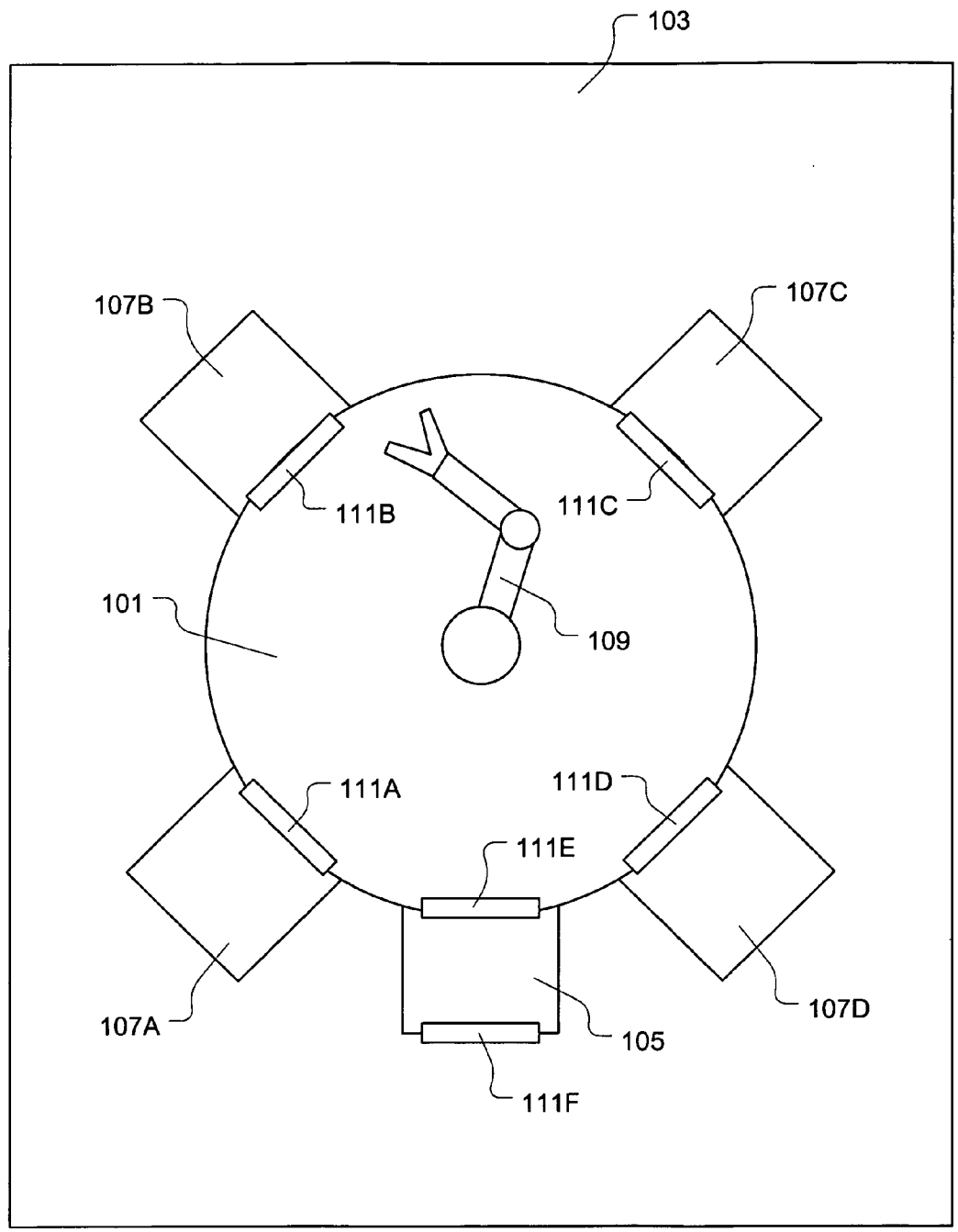
FIG. 1 is an illustration showing a number of wafer processing modules attached to a wafer transfer module, in accordance with the prior art.
Figure 2A:
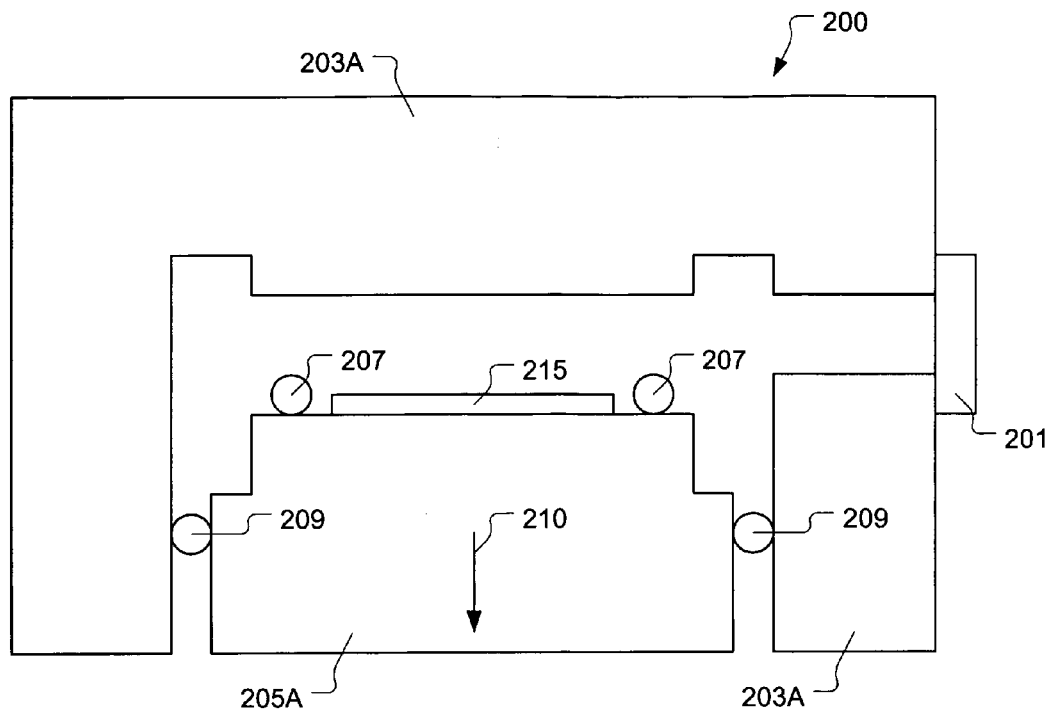
FIG. 2A is an illustration showing a wafer processing chamber in an open state, in accordance with one embodiment of the present invention.

FIG. 2A is an illustration showing a wafer processing chamber ("chamber") 200 in an open state, in accordance with one embodiment of the present invention. The chamber 200 includes an upper section 203A and a lower section 205A. The upper section 203A is secured in an immobile condition. The immobile condition refers to the upper section 203A remaining stationary with respect to surrounding components including the lower section 205A. The lower section 205A is configured to be moved up and down with respect to the upper section 203A. The movement of the lower section 205A can be controlled by a number of mechanisms. For example, in one embodiment, the movement of the lower section 205A is controlled by a screw drive. In another embodiment, the movement of the lower section 205A is controlled by a hydraulic drive. In FIG. 2A, the lower section 205A is moved down as indicated by an arrow 210. The chamber 200 is configured to interface with a valve 201. In one embodiment, the valve 201 is either a slit valve or a gate valve. However, other embodiments can use a different type of valve 201. When the valve 201 is opened, a wafer 215 can be transferred into or out of the chamber 200. In one embodiment, the wafer 215 can be placed on lifting pins within the chamber 200. The lifting pins can be used to position the wafer vertically within the chamber 200 as needed. The valve 201 also serves to isolate volumes located on each side of the valve 201 from one another. The chamber 200 further includes a seal 207 for isolating volumes within the chamber 200 from one another. The seal 207 is configured to enclose a periphery of the wafer 215 to be processed within the chamber. A seal 209 is also provided to isolate a volume within the chamber from an outside environment. In one embodiment, the outside environment is contained within a wafer transfer module. In another embodiment, the outside environment is contained within a clean room.

Figure 2B:
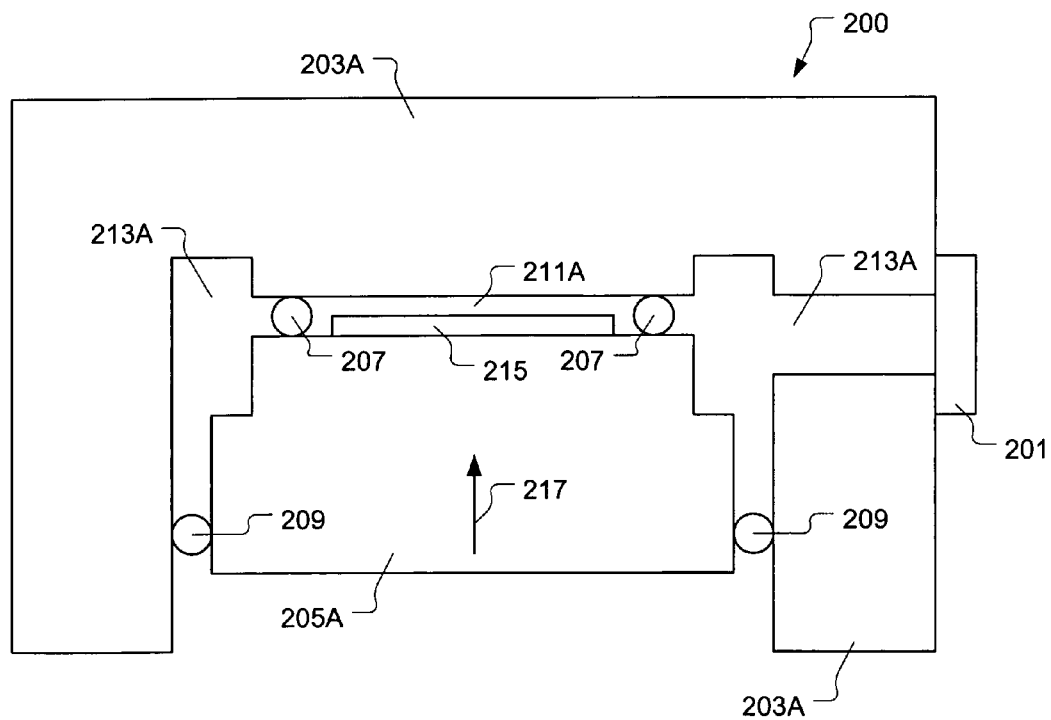
FIG. 2B is an illustration showing the chamber in a closed state, in accordance with one embodiment of the present invention.

FIG. 2B is an illustration showing the chamber 200 in a closed state, in accordance with one embodiment of the present invention. The chamber 200 includes the upper section 203A, the lower section 205A, the valve 201, the seal 207, and the seal 209 as previously described with respect to FIG. 2A. However, the lower section 205A is shown to be moved up as indicated by an arrow 217. When the lower section 205 is moved up, the seal 207 engages the upper section 203A. The seal 207 can be a c-seal, an o-ring, a flat gasket, or a similar sealing mechanism. Also, the seal 207 can be formed by multiple seals. A sufficient upward force is applied to the lower section 205A to enable the seal 207. Once enabled, the seal 207 serves to isolate a wafer processing volume 211A from an outer volume 213A. All wafer processing is performed in the wafer processing volume 211A. Fluid inlets and fluid outlets can be disposed within the upper section 203A and/or the lower section 205A for introducing fluid into and removing fluid from each of the wafer processing volume 211A and the outer volume 213A. The seal 209 serves to isolate the outer volume 213A from the outside environment. The seal 209 can be an o-ring or a similar sealing mechanism. Also, the seal 209 can be formed by multiple seals. The valve 201 serves to isolate the outer volume 213A. In one embodiment, the valve 201 isolates the outer volume 213A from a wafer transfer module. In other embodiments, the valve 201 is capable of isolating the outer volume 213A from other environments outside the chamber 200, such as a clean room.

Figure 3A:
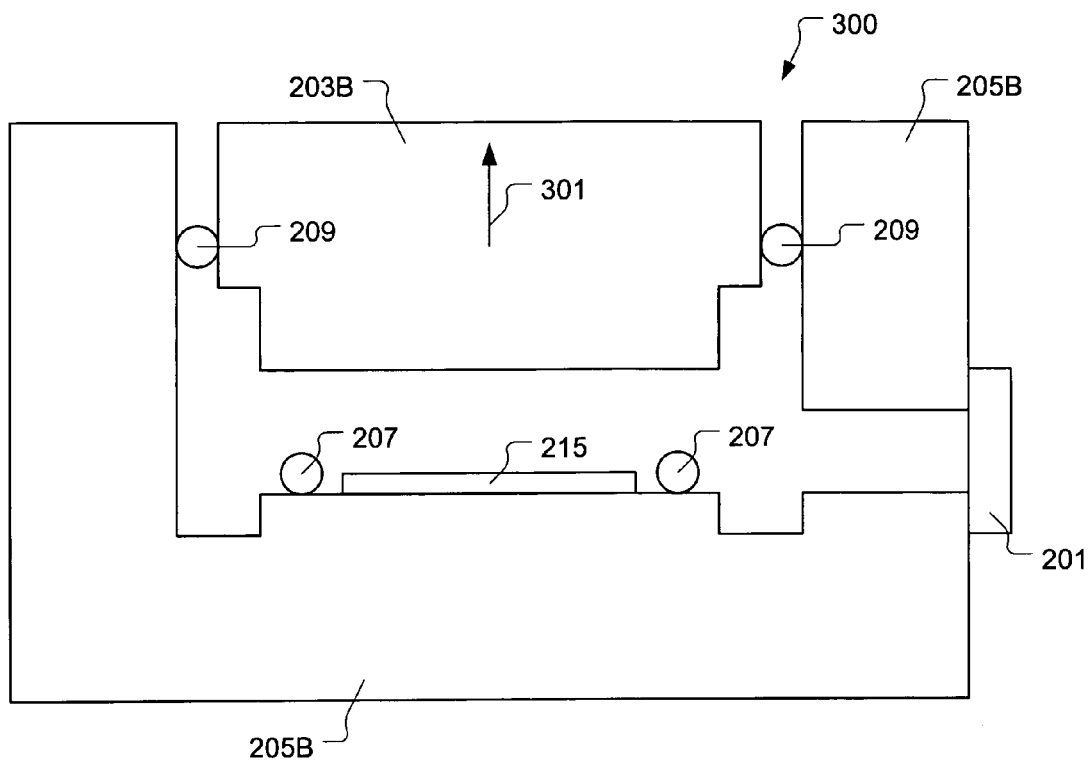
FIG. 3A is an illustration showing a wafer processing chamber in an open state, in accordance with one embodiment of the present invention.

FIG. 3A is an illustration showing a wafer processing chamber ("chamber") 300 in an open state, in accordance with one embodiment of the present invention. The chamber 300 includes an upper section 203B and a lower section 205B. The lower section 205B is secured in an immobile condition. The immobile condition refers to the lower section 205B remaining stationary with respect to surrounding components including the upper section 203B. The upper section 203B is configured to be moved up and down with respect to the lower section 205B. The movement of the upper section 203B can be controlled by a number of mechanisms. For example, in one embodiment, the movement of the upper section 203B is controlled by a screw drive. In another embodiment, the movement of the upper section 203B is controlled by a hydraulic drive. In FIG. 3A, the upper section 203B is moved up as indicated by an arrow 301. As with the chamber 200, the chamber 300 is also configured to interface with the valve 201 through which the wafer 215 can be transferred. In one embodiment, the wafer 215 can be placed on lifting pins within the chamber 300. The lifting pins can be used to position the wafer vertically within the chamber 300 as needed. The chamber 300 also includes the seal 207 for isolating volumes within the chamber 300 from one another. As previously described, the seal 207 is configured to enclose a periphery of the wafer 215 to be processed within the chamber 300. The seal 209 is also provided to isolate a volume within the chamber from the outside environment.

Figure 3B:
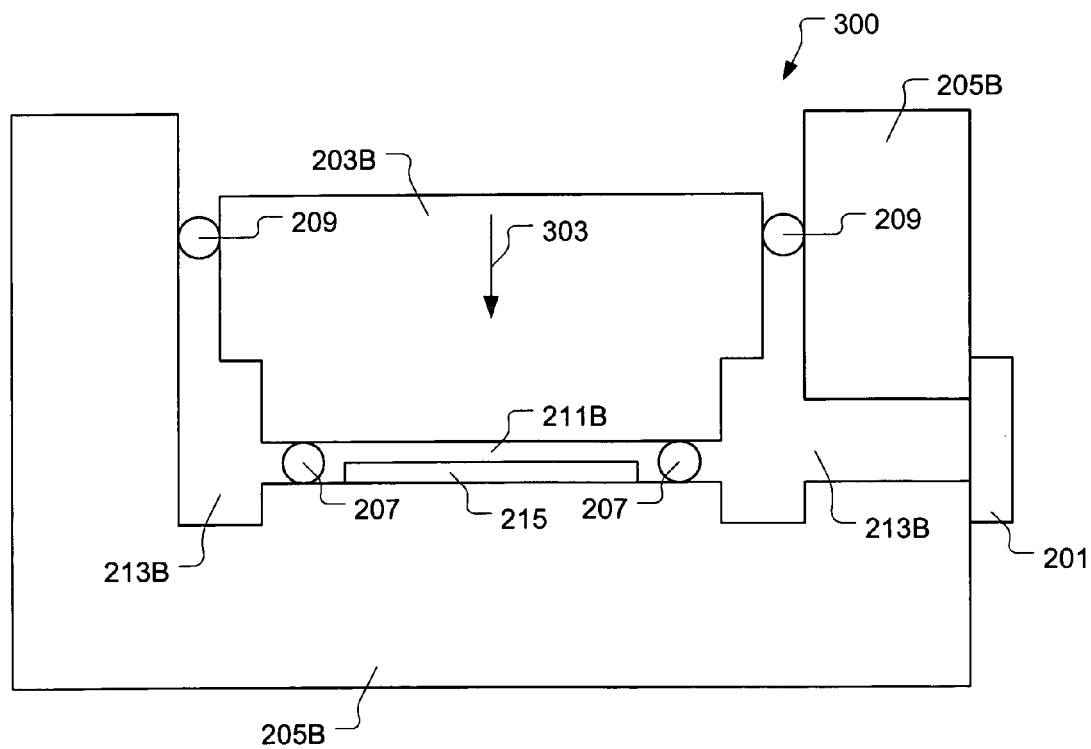
FIG. 3B is an illustration showing the chamber in a closed state, in accordance with one embodiment of the present invention.

FIG. 3B is an illustration showing the chamber 300 in a closed state, in accordance with one embodiment of the present invention. The chamber 300 includes the upper section 203B, the lower section 205B, the valve 201, the seal 207, and the seal 209 as previously described with respect to FIG. 3A. However, the upper section 203B is shown to be moved down as indicated by an arrow 303. When the upper section 203B is moved down, the seal 207 engages the upper section 203B. A sufficient downward force is applied to the upper section 203B to enable the seal 207. Once enabled, the seal 207 serves to isolate a wafer processing volume 211B from an outer volume 213B. All wafer processing is performed in the wafer processing volume 211B. Fluid inlets and fluid outlets can be disposed within the upper section 203B and/or the lower section 205B for introducing fluid into and removing fluid from each of the wafer processing volume 211B and the outer volume 213B. The seal 209 serves to isolate the outer volume 213B from the outside environment. Also, the valve 201 serves to isolate the outer volume 213B. In one embodiment, the valve 201 isolates the outer volume 213B from a wafer transfer module. In other embodiments, the valve 201 is capable of isolating the outer volume 213B from other environments outside the chamber 300, such as a clean room.

The wafer processing volumes 211A and 211B are smaller that the outer volumes 213A and 213B, respectively. The wafer processing volumes 211A and 211B are defined to have a minimal size in order to minimize a force necessary to constrain pressures within the wafer processing volumes 211A and 211B. At higher pressures, more force is required to maintain the seal 207 between the wafer processing volumes 211A and 211B and the outer volumes 213A and 213B, respectively. One advantage of having separate wafer processing volumes 211A and 211B, is that they can be configured to have a minimal size to withstand higher pressures. The wafer processing volumes 211A and 211B and the seal 207 can be configured to contain high pressures within a range extending from about 68 atm (about 1000 psig) to about 273 atm (about 4000 psig). As used herein, the term "about" means within ±10% of a specified value.

The chamber outer volumes 213A and 213B serve as a buffer between the wafer processing volumes 211A and 211B, respectively, and the environment outside the chamber. Serving as the buffer, the outer volumes 213A and 213B can be used to transition from a high pressure contained within the wafer processing volumes 211A and 211B, respectively, to a lower pressure in the environment outside the chamber. In this manner, a differential pressure between the wafer processing volumes 211A and 211B and the environment outside the chamber can be controlled. In one embodiment where the valve 201 is used to separate the outer volumes 213A and 213B from the environment outside the chamber, the outer volumes 213A and 213B can contain a pressure within a range extending from about 6E-5 atm (about 50 mTorr) to about 1.02 atm (about 15 psig).

Incorporation of an inner wafer processing volume that is separate from an outer volume within the chamber allows the chamber to be adaptable to both an atmospheric and a vacuum wafer transfer module. The outer chamber volume can be maintained at a nominal pressure, including a subatmospheric pressure, in order to prevent free transfer of material between the environment outside the chamber (i.e., within the wafer transfer module) and the wafer processing volume, or vice-versa. When using the chamber in connection with a wafer transfer module under a vacuum condition, the chamber outer volume can be maintained at a subatmospheric pressure to reduce the pressure differential between the wafer processing volume and the wafer transfer module. Maintaining the chamber outer volume at the subatmospheric pressure also reduces the potential for material to flow directly from the wafer processing volume to the wafer transfer module. When using the chamber in connection with a wafer transfer module under atmospheric pressure, the chamber outer volume can be maintained at a pressure greater than atmospheric to protect the wafer processing volume from potential contaminants contained within the atmosphere of the wafer transfer module.

Figure 4:
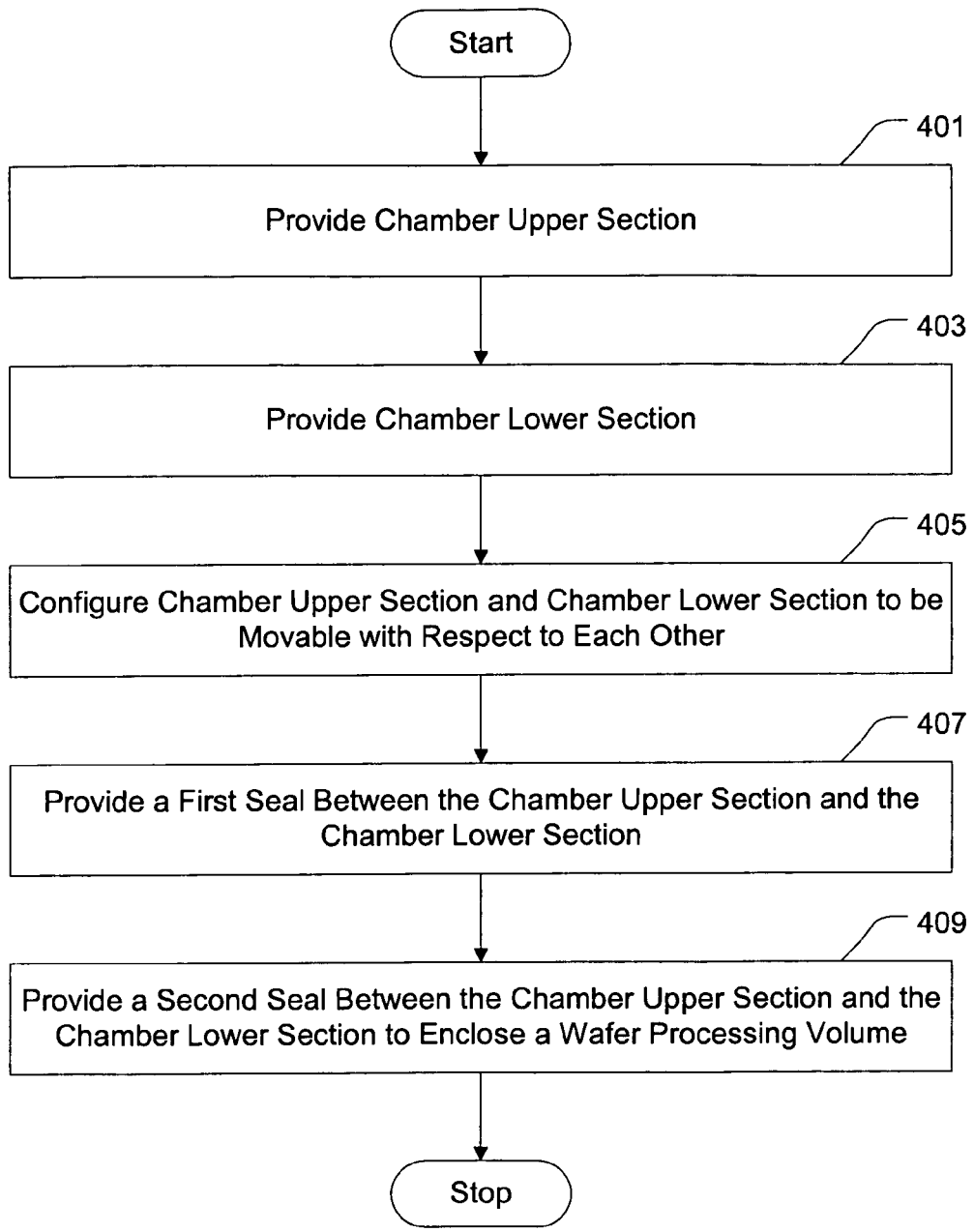
FIG. 4 is an illustration showing a flowchart of a method for making a wafer processing chamber, in accordance with one embodiment of the present invention.

FIG. 4 is an illustration showing a flowchart of a method for making a wafer processing chamber, in accordance with one embodiment of the present invention. The method includes an operation 401 in which a chamber upper section is provided. The method also includes an operation 403 in which a chamber lower section is provided. In an operation 405, the chamber upper section and the chamber lower section are configured to be movable with respect to each other. The method further includes an operation 407 in which a first seal is provided between the chamber upper section and the chamber lower section. The first seal serves to isolate a chamber outer volume from an outside environment. Additionally in the method, an operation 409 is performed in which a second seal is provided between the chamber upper section and the chamber lower section. The second seal is configured to enclose a periphery of the wafer processing volume. Also, the second seal serves to isolate the wafer processing volume from the chamber outer volume. In one embodiment, the chamber upper section, the chamber lower section, and the second seal are configured to withstand a pressure within the wafer processing volume within a range extending from about 68 atm (about 1000 psig) to about 273 atm (about 4000 psig).

The second seal is enabled through contact with both the chamber upper section and the chamber lower section. In one embodiment, the chamber upper section is secured in a fixed position and the chamber lower section is connected to a movement mechanism. In this embodiment, the contact between the second seal and both the chamber upper section and the chamber lower section is created by operating the movement mechanism to cause the chamber lower section to move toward and contact the chamber upper section. In another embodiment, the chamber lower section is secured in a fixed position and the chamber upper section is connected to a movement mechanism. In this embodiment, the contact between the second seal and both the chamber upper section and the chamber lower section is created by operating the movement mechanism to cause the chamber upper section to move toward and contact the chamber lower section.

The wafer processing chamber of the present invention is well suited for use in a wafer process that utilizes a supercritical fluid. As previously described, the wafer processing chamber is suited for providing a high pressure within the wafer processing volume. Additionally, the wafer processing chamber is capable of controlling the pressure differentials that exist between the wafer processing volume, the chamber outer volume, and the environment outside the chamber. Having an ability to adjust the wafer processing volume pressure relative to the chamber outer volume pressure, as afforded by the present invention, is valuable in designing a supercritical fluid processing chamber that can be interfaced with a conventional wafer transfer module utilizing conventional slit valves or gate valves. Also, having an ability to maintain a high pressure within the wafer processing volume, as afforded by the present invention, is important for maintaining a supercritical fluid in a supercritical state for wafer processing.

Figure 5:
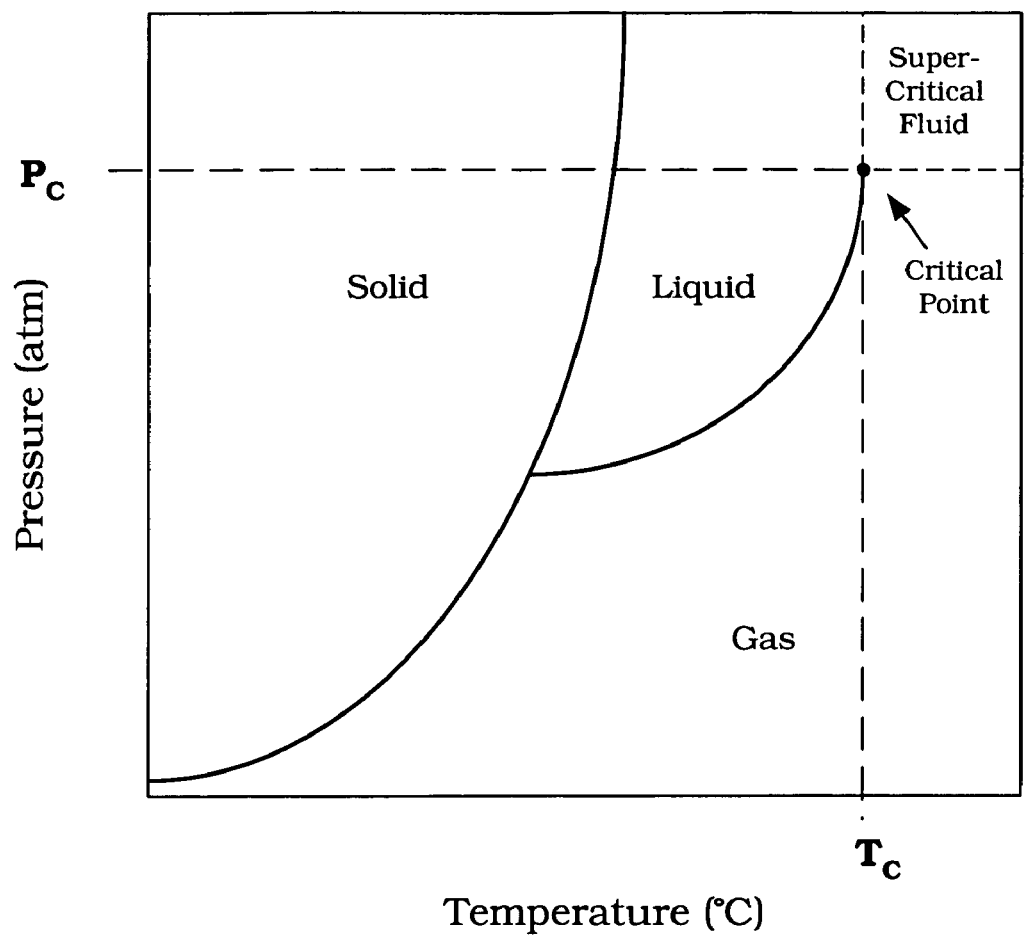
FIG. 5 is an illustration showing a generalized material phase diagram.

FIG. 5 is an illustration showing a generalized material phase diagram. The phase of the material is represented as regions of solid, liquid, and gas, wherein the presence of a particular phase is dependent on pressure and temperature. The gas-liquid phase boundary follows an increase in both pressure and temperature up to a point called the critical point. The critical point is delineated by a critical pressure ($P_c$) and a critical temperature ($T_c$). At pressures and temperatures beyond $P_c$ and $T_c$, the material becomes a supercritical fluid.

Wafer cleaning operations can be performed within the wafer processing volume using the supercritical fluid. The supercritical fluid shares the properties of both a gas phase and a liquid phase. The supercritical fluid has near zero surface tension. Therefore, the supercritical fluid can reach into and between small features on the wafer surface. Also, the supercritical fluid has a diffusivity property similar to a gas. Therefore, the supercritical fluid can get into porous regions of wafer materials, such as low-K dielectric material, without becoming trapped. Additionally, the supercritical fluid has a density similar to a liquid. Therefore, more supercritical fluid can be transported to the wafer in a given amount of time as compared to a gas.

Wafer processing with the supercritical fluid must be performed at high pressures to maintain the supercritical state of the fluid. For example, supercritical fluid processing can be performed at pressures ranging from about 68 atm (about 1000 psig) to about 273 atm (about 4000 psig). Therefore, the wafer processing chamber must be able to withstand the associated high pressures. The wafer processing chamber of the present invention is capable of withstanding and controlling the high pressures associated with supercritical fluids.

Generally speaking, in supercritical fluid processes, the wafer processing volume is pressurized and the temperature within the wafer processing volume is controlled. The wafer processing volume pressure and temperature are controlled to maintain a supercritical fluid state. In an exemplary embodiment, the wafer processing volume can be pre-pressurized with $CO_2$ only or with a mixture of $CO_2$ and an appropriate chemistry. The critical pressure and temperature for $CO_2$ is approximately 73 atm and 31° C., respectively. It should be noted that the supercritical fluid used in combination with the wafer processing chamber of the present invention is not restricted to $CO_2$. Other suitable supercritical fluids can also be used. Additionally, the chemistry of the supercritical fluid may include additives such as co-solvents, co-chelating agents, surfactants, or any combination thereof. The additives contained within the supercritical fluid can be useful for performing specific functions, such as dissolving and removing photoresist, dissolving and removing organic residue, and chelating metals, among others.

The wafer processing chamber of the present invention can be incorporated into a wafer processing cluster architecture. In one example, the wafer processing cluster architecture can incorporate separate modules for performing wafer cleaning operations, wafer etching operations, CMP operations, and wafer rinsing operations. Additionally, in the wafer processing cluster architecture, the wafer can be transferred between different modules using a robotic wafer handling mechanism or a track mechanism.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A wafer processing chamber, comprising:
an upper section secured in an immobile state, the upper section including a cavity region defined by a cavity sidewall and a cavity top surface, the cavity region being openly accessible at a bottom surface of the upper section, the upper section having a pathway for receiving a wafer into the cavity region;
a lower section connected to a movement mechanism, the lower section being defined by a top surface and a sidewall, the lower section configured to be moved into the cavity region of the upper section such that the sidewall of the lower section is adjacent to the cavity sidewall;
a first seal disposed between the cavity sidewall and the lower section sidewall; and
a second seal disposed on the top surface of the lower section, the second seal configured to be enabled through contact with both the cavity top surface and the top surface of the lower section, the second seal being configured to enclose a periphery of a wafer processing volume when contacting both the cavity top surface and the top surface of the lower section.

2. A wafer processing chamber as recited in claim 1, further comprising:
a valve attached to an outside of the upper section to cover the pathway for receiving the wafer, the valve being operable to isolate the pathway for receiving the wafer from an outside environment, the outside environment having one of an atmospheric pressure and a sub-atmospheric pressure.

3. A wafer processing chamber as recited in claim 1, wherein the pathway for receiving the wafer is configured to interface with one of a clean room and a wafer transfer module, the wafer transfer module containing one of an atmospheric pressure and a sub-atmospheric pressure.

4. A wafer processing chamber as recited in claim 1, wherein the first seal serves to isolate a chamber outer volume from both the wafer processing volume and an outside environment, the chamber outer volume being defined between the second seal and the first seal, the second seal serving to isolate the wafer processing volume from the chamber outer volume.

5. A wafer processing chamber as recited in claim 1, wherein the first seal is capable of containing a pressure within a range extending from about 6E-5 atm to about 1.02 atm.

6. A wafer processing chamber as recited in claim 1, wherein the second seal is capable of containing a pressure within the wafer processing volume within a range extending from about 68 atm to about 273 atm.

7. A wafer processing chamber as recited in claim 1, wherein the second seal is one of a c-seal, an o-ring, and a flat gasket.

8. A wafer processing chamber as recited in claim 1, wherein multiple seals are used for one of the first seal, the second seal, and both the first seal and the second seal.

9. A wafer processing chamber as recited in claim 1, wherein both the chamber upper section and the chamber lower section are capable of containing a pressure within the wafer processing volume within a range extending from about 68 atm to about 273 atm.

10. A wafer processing chamber as recited in claim 1, wherein the wafer processing volume is capable of containing and maintaining a supercritical fluid.

11. A wafer processing chamber as recited in claim 1, wherein the movement mechanism is one of a screw drive and a hydraulic drive.

12. A wafer processing chamber, comprising:
a lower section secured in an immobile state, the lower section including a cavity region defined by a cavity sidewall and a cavity bottom surface, the cavity region being openly accessible at a top surface of the lower section, the lower section having a pathway for receiving a wafer into the cavity region;
an upper section connected to a movement mechanism, the upper section being defined by a bottom surface and a sidewall, the upper section configured to be moved into the cavity region of the lower section such that the sidewall of the upper section is adjacent to the cavity sidewall;
a first seal disposed between the cavity sidewall and the upper section sidewall; and
a second seal disposed on the cavity bottom surface, the second seal configured to be enabled through contact with both the cavity bottom surface and the bottom surface of the upper section, the second seal being configured to enclose a periphery of a wafer processing volume when contacting both the cavity bottom surface and the bottom surface of the upper section.

13. A wafer processing chamber as recited in claim 12, further comprising:
a valve attached to an outside of the lower section to cover the pathway for receiving the wafer, the valve being operable to isolate the pathway for receiving the wafer from an outside environment, the outside environment having one of an atmospheric pressure and a sub-atmospheric pressure.

14. A wafer processing chamber as recited in claim 12, wherein the pathway for receiving the wafer is configured to interface with one of a clean room and a wafer transfer module, the wafer transfer module containing one of an atmospheric pressure and a sub-atmospheric pressure.

15. A wafer processing chamber as recited in claim 12, wherein the first seal serves to isolate a chamber outer volume from both the wafer processing volume and an outside environment, the chamber outer volume being defined between the second seal and the first seal, the second seal serving to isolate the wafer processing volume from the chamber outer volume.

16. A wafer processing chamber as recited in claim 12, wherein the first seal is capable of containing a pressure within a range extending from about 6E-5 atm to about 1.02 atm.

17. A wafer processing chamber as recited in claim 12, wherein the second seal is capable of containing a pressure within the wafer processing volume within a range extending from about 68 atm to about 273 atm.

18. A wafer processing chamber as recited in claim 12, wherein the second seal is one of a c-seal, an o-ring, and a flat gasket.

19. A wafer processing chamber as recited in claim 12, wherein multiple seals are used for one of the first seal, the second seal, and both the first seal and the second seal.

20. A wafer processing chamber as recited in claim 12, wherein both the chamber lower section and the chamber upper section are capable of containing a pressure within the wafer processing volume within a range extending from about 68 atm to about 273 atm.

21. A wafer processing chamber as recited in claim 12, wherein the wafer processing volume is capable of containing and maintaining a supercritical fluid.

22. A wafer processing chamber as recited in claim 12, wherein the movement mechanism is one of a screw drive and a hydraulic drive.

23. A wafer processing chamber as recited in claim 1, wherein the wafer processing chamber is part of a wafer processing cluster architecture.

24. A wafer processing chamber, comprising:
an upper section including a cavity region defined by a cavity sidewall and a cavity top surface, the cavity region being openly accessible at a bottom surface of the upper section;
a lower section defined by a top surface and a sidewall, the lower section configured to be moved into the cavity region of the upper section such that the sidewall of the lower section is adjacent to the cavity sidewall, the top surface of the lower section including an area defined to receive a wafer to be processed;
a first seal disposed between the cavity sidewall and the lower section sidewall; and
a second seal disposed on the top surface of the lower section outside the area defined to receive the wafer to be processed, the second seal configured to be enabled through contact with both the cavity top surface and the top surface of the lower section.

* * * * *